(12) United States Patent
Friedman et al.

(10) Patent No.: US 6,412,086 B1
(45) Date of Patent: Jun. 25, 2002

(54) RADIO FREQUENCY IDENTIFICATION TRANSPONDER INTEGRATED CIRCUIT HAVING A SERIALLY LOADED TEST MODE REGISTER

(75) Inventors: Daniel J. Friedman, Tarrytown, NY (US); David E. Dieska, Longwood, FL (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/323,429

(22) Filed: Jun. 1, 1999

Related U.S. Application Data

(60) Provisional application No. 60/087,454, filed on Jun. 1, 1998.

(51) Int. Cl.$^7$ .......................... G01R 31/28; G06F 11/00; G08C 25/00; H03M 13/00; H04L 1/00
(52) U.S. Cl. ..................................... 714/733; 714/799
(58) Field of Search ................................ 714/712–745, 714/726–731, 718–723

(56) References Cited

U.S. PATENT DOCUMENTS

| | | | | |
|---|---|---|---|---|
| 5,521,904 A | * | 5/1996 | Eriksson et al. ............. 370/249 |
| 5,612,960 A | * | 3/1997 | Stevens et al. .............. 714/712 |
| 5,648,972 A | * | 7/1997 | Gharakhanian ............. 714/716 |
| 5,657,332 A | * | 8/1997 | Auclair et al. .............. 714/763 |
| 5,742,618 A | * | 4/1998 | Lowe ........................ 714/797 |
| 5,825,782 A | * | 10/1998 | Roohparvar ................. 714/718 |
| 5,838,693 A | * | 11/1998 | Morley ........................ 714/726 |
| 5,872,455 A | * | 2/1999 | Pohribnij et al. ........... 324/509 |
| 5,983,363 A | * | 11/1999 | Tuttle et al. ................... 714/25 |
| 5,986,570 A | * | 11/1999 | Black et al. ............... 340/10.2 |
| 6,028,449 A | * | 2/2000 | Schmitt ...................... 326/80 |
| 6,130,602 A | * | 10/2000 | O'Toole et al. .......... 340/10.33 |
| 6,195,764 B1 | * | 2/2001 | Caldara et al. ............... 714/30 |

OTHER PUBLICATIONS

'High speed tag testing system', Innovative Design Associates, http://www.beer.org/~tpark/innov.html, Aug. 12, 1997.*

J.S. Kasten and B. Kaminska, 'An introduction to RF testing: device, method and system', Proceedings 16th IEEE VLSI Test Symposium, 1998, pp. 462–468.*

Common On–Chip Processor for Built–In Self–Test Debug Field Support, Publication–Data: IBM Technical Disclosure Bulletin, Jul. 1990, US; vol. No. 33; Issue No. 2; pp. No. 2–8; Publication–Date: Jul. 1, 1990.*

* cited by examiner

*Primary Examiner*—Phung M. Chung
*Assistant Examiner*—Joseph D. Torres
(74) *Attorney, Agent, or Firm*—Rodney T. Hodgson

(57) ABSTRACT

A radio frequency identification (RFID) transponder (tag) integrated circuit includes "on-chip" test circuitry. The test circuitry includes a serially-loaded test register. The test register controls the execution of on-chip tests. Such tests may include the testing of EEPROM circuitry included within the IC, the testing of analog circuitry, or the testing of digital circuitry included within the IC.

30 Claims, 4 Drawing Sheets

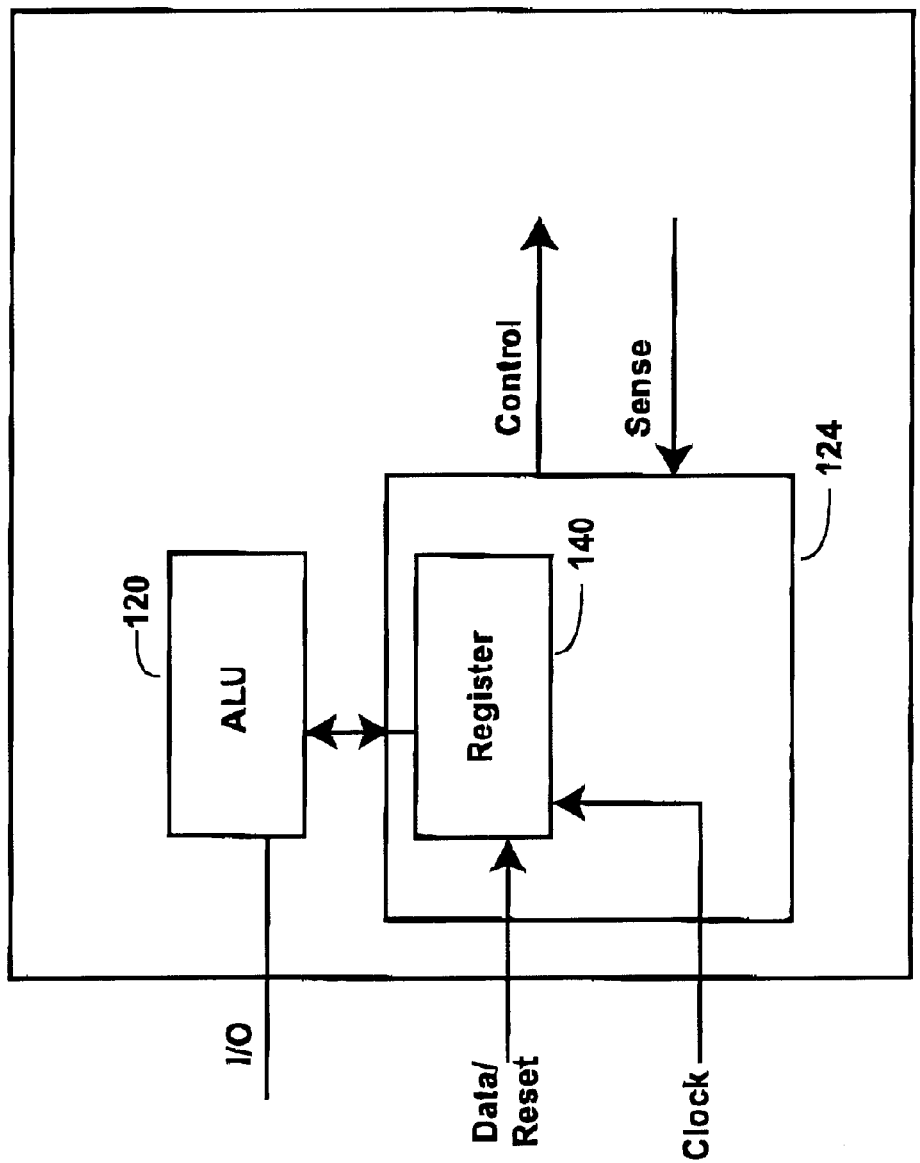

RADIO FREQUENCY IDENTIFICATION TRANSPONDER INTEGRATED CIRCUIT HAVING A SERIALLY LOADED TEST MODE REGISTER

CROSS-REFERENCE TO RELATED APPLICATIONS

The applicants claim priority under 35 U.S.C. 119 (e) for provisional application Ser. No. 60/087,454 filed on Jun. 1, 1998, entitled, "SERIALLY LOADED TEST MODE REGISTER FOR PASSIVE RFID TAGS", which is hereby incorporated herein by reference in its entirety.

FIELD OF THE INVENTION

The invention relates to radio frequency identification (RFID) tag integrated circuits (ICs) and, more particularly, to RFID tag ICs that include on-chip test circuitry.

BACKGROUND OF THE INVENTION

Radio Frequency Identification (RFID) transponders (tags) are operated in conjunction with RFID base stations for a variety of inventory-control, security and other purposes. Typically an item having a tag associated with it, for example, a container with a tag placed inside it, is brought into a "read zone" established by the base station. The RFID base station generates a continuous wave electromagnetic disturbance at a carrier frequency. This disturbance is modulated to correspond to data that is to be communicated via the disturbance. The modulated disturbance, which carries information and may be sometimes referred to as a signal, communicates this information at a rate, referred to as the data rate, which is lower than the carrier frequency. The transmitted disturbance will be referred to hereinafter as a signal or field. The RFID base station transmits an interrogating RF signal which is modulated by a receiving tag in order to impart information stored within the tag to the signal. The receiving tag then transmits the modulated, answering, RF signal to the base station.

RFID tags may be active, containing their own RF transmitter, or passive, having no transmitter. Passive tags, i.e., tags that rely upon modulated back-scattering to provide a return link to an interrogating base station, may include their own power sources, such as a batteries, or they may be "field-powered", whereby they obtain their operating power by rectifying an interrogating RF signal that is transmitted by a base station. Although both types of tag have minimum RF field strength read requirements, or read thresholds, in general, a field-powered passive system requires at least an order of magnitude more power in the interrogating signal than a system that employs tags having their own power sources. Because the interrogating signal must provide power to a field-powered passive tag, the read threshold for a field-powered passive tag is typically substantially higher than for an active tag. However, because field-powered passive tags do not include their own power source, they may be substantially less expensive than active tags and because they have no battery to "run down", field-powered passive tags may be more reliable in the long term than active tags. And, finally, because they do not include a battery, field-powered passive tags are typically much more "environmentally-friendly".

Although field-powered passive tag RFID systems provide cost, reliability, and environmental benefits, there are obstacles to the efficient operation of field-powered passive tag RFID systems. In particular, it is often difficult to deliver sufficient power from a base station to a field-powered passive tag via an interrogating signal. The amount of power a base station may impart to a signal is limited by a number of factors, not the least of which is regulation by the Federal Communication Commission (FCC). In addition to limits placed upon the base station's transmitted power, i.e., the power level at the base station's antenna input, RFID tags are often affixed to the surface of or placed within, a container composed of RF absorptive material. The container may move along a conveyor or roller system and, as the container enters the reading zone of a reading station, an interrogating signal is transmitted to the container. Ideally, the tag would be read regardless of the tag's location within the container or the orientation of the container as it passes the reading station. Unfortunately, the electromagnetic field pattern set up by an RF signal will typically include areas of relatively low field strength which preclude the reading of RF tags as they pass by a reading station. In the case of such a reading failure, a human operator may have to intervene by re-orienting the container and passing it by the read station once more. Alternatively, human operators may be required to orient containers in a preferred orientation so that the containers may be reliably read as they pass the reading station. Such human intervention can be a costly, time consuming, and relatively unreliable approach.

An RFID tag integrated circuit, which combines a variety of functions and technologies on a single integrated circuit, may be employed to reduce the costs, weight, and bulk of an RFID tag to a minimum. At the same time such an integrated circuit implementation provides the potential of greatly improving the reliability of an RFID tag. However, an integrated circuit implementation of an RFID tag's functionality might incorporate disparate functional blocks, such as a radio frequency front end processor for processing received radio signals, a signal processor for producing a return signal, control circuitry, and storage circuitry for retaining tag-related information. These functional elements may include analog, digital and memory circuitry. In a field-powered tag application the tag could employ electrically erasable programmable read only memory (EEPROM) to store and update tag-related information. As a result, the tag IC includes several disparate functional elements and it would be highly advantageous to include within the tag IC test circuitry that permits the efficient testing of such functional elements without devoting an excessive amount of circuitry or IC pins to the test function.

RELATED ISSUED PATENTS

Related U.S. Patents assigned to the assignee of the present invention include: U.S. Pat. Nos. 5,521,601; 5,528,222; 5,550,547; 5,673,037; 5,682,143; 5,786,626; 5,850,181; and 5,874,902. The above identified U.S. Patents and U.S. Patent applications are hereby incorporated by reference.

SUMMARY

A radio-frequency identification (RFID) transponder (tag) integrated circuit (IC) in accordance with the principles of the invention includes a serially loaded test mode register. The test mode register communicates with test circuitry also included within the IC to initiate testing one or more sections of the IC. In an illustrative embodiment, the tag IC includes a front end processor for processing received radio signals, a signal processor for producing a return signal, and the test circuitry, including the serially loaded test mode register.

In addition to the above functional divisions (i.e., front end, signal processing, etc.) the tag IC may include process divisions, in that it may include digital, analog, and EEPROM circuitry. Each segment of the tag IC may test circuitry associated with it, and the test circuitry may be controlled by entries in the serial test mode register. The tag IC's digital section may be tested via a partial scan that tests the IC data path and control logic. The digital section may also be tested by testing the IC's digital clock recovery and data recovery circuitry. The EEPROM circuitry may be tested by testing the write margin of the EEPROM, by "bulk even", "bulk lock", and "bulk odd" testing, and by control verification tests. The tag IC may also include analog circuitry and the test circuitry may test circuit parametrics, such as the tag IC's current drain, and bias levels.

The new tag IC may be operated in conjunction with an antenna to yield an RFID tag. Such a tag, in turn, may be operated along with an RFID base station to perform the functions of an RFID system.

BRIEF DESCRIPTION OF THE DRAWINGS

The above and further features, aspects, and advantages of the invention will be apparent to those skilled in the art from the following detailed description, taken together with the accompanying drawings in which:

FIG. 4 is a conceptual block diagram of test circuitry included in an RFID tag integrated circuit in accordance with the principles of the present invention.

DETAILED DESCRIPTION

Figure 1:
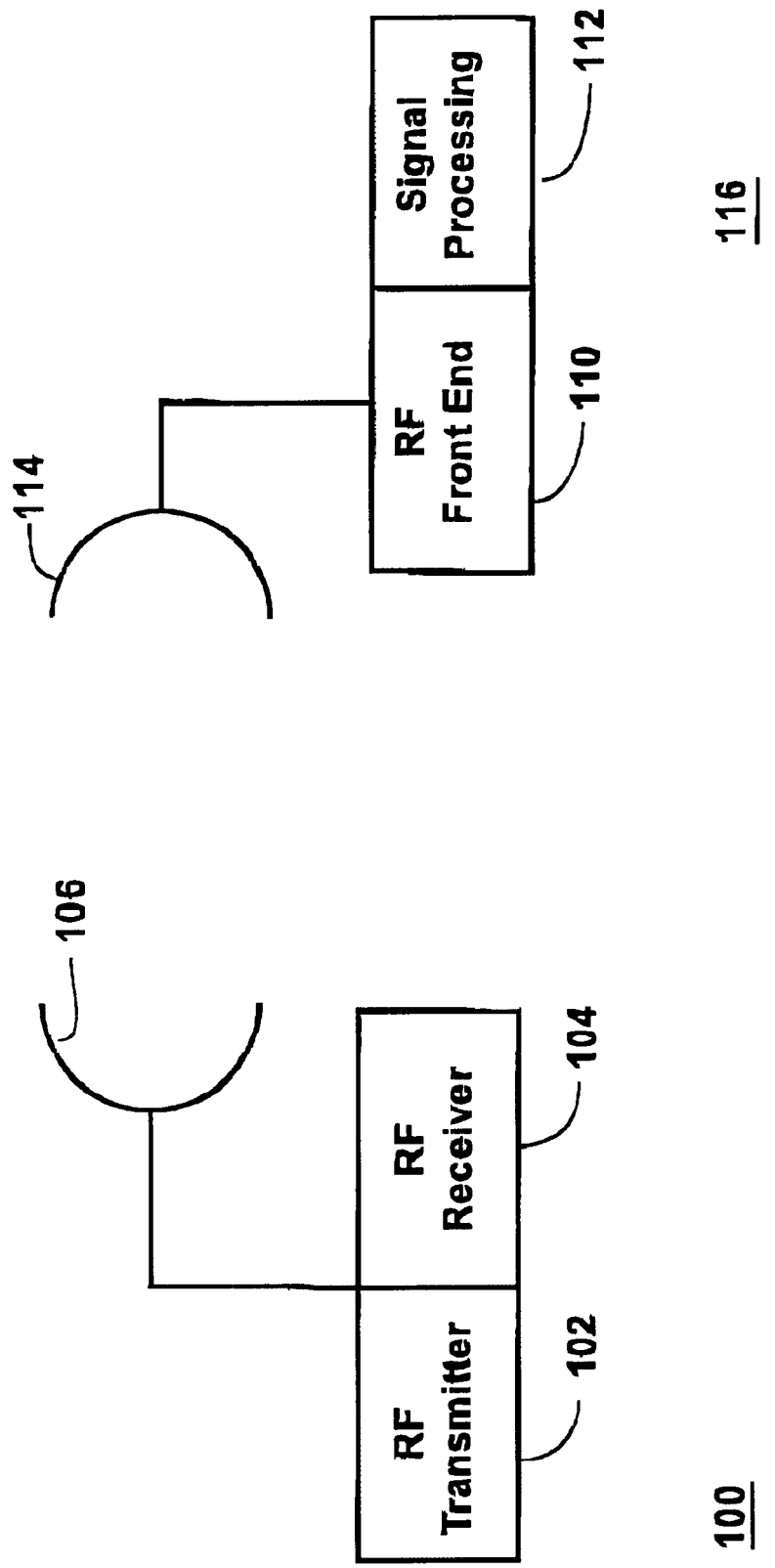
FIG. 1 is a conceptual block diagram of an RFID system in accordance with the principles of the invention.

A radio-frequency identification (RFID) transponder (tag) integrated circuit (IC) in accordance with the principles of the invention includes a serially loaded test mode register that communicates with on-chip test circuitry. The serially loaded test register permits a wide variety of tests to be performed, while consuming a minimum of IC pins. The new tag IC may be operated in conjunction with an antenna to yield an RFID tag which may be used in an RFID system such as that illustrated in the conceptual block diagram of FIG. 1. An RF base station 100 includes an RF transmitter 102, an RF receiver 104, and an antenna 106 connected to the transmitter 102 and receiver 104. An RF tag 116 such as may be used in conjunction with the base station 100 includes an RF front end 110, a signal processing section 112, and an antenna 114 which provides high gain, low axial ratio, high directivity operation over a relatively wide frequency band.

In operation, the base station 100 interrogates the tag 116 by generating an RF signal having a carrier frequency $F_c$. The carrier frequency $F_c$ is chosen based on a number of factors known in the art, including the amount of power permitted at that frequency by FCC regulations. The RF signal is coupled to the antenna 106 and transmitted to the tag 116. As will be discussed in greater detail below, the tag may be employed in a number of applications, but is particularly suited to industrial or warehousing applications in which the tag may be mounted within a plastic container that is, in turn, mounted on or within a pallet. The container associated with the tag 116 is typically moved into a "read zone" within which it is intended that the RF tag will be successfully interrogated.

The RF signal emitted by the antenna 106, will, ostensibly, be received by the tag antenna 114 and, if the RF signal's field strength meets a read threshold requirement, the RF tag will respond to the reception of the signal by modulating the RF carrier to impart information about the associated container onto the back-scattered RF field, which propagates to the base station 100. The RF signal transmitted by the base station 100 must have sufficient field strength, taking into account the polarization of the signal and of the tag's antenna, at the location of the tag 116 for the tag to detect the RF signal. In the case of a field-powered passive tag, the interrogating signal's field strength generally must be great enough for the tag 116 to rectify the signal and to use the signal's energy for the tag's power source.

Figure 2:
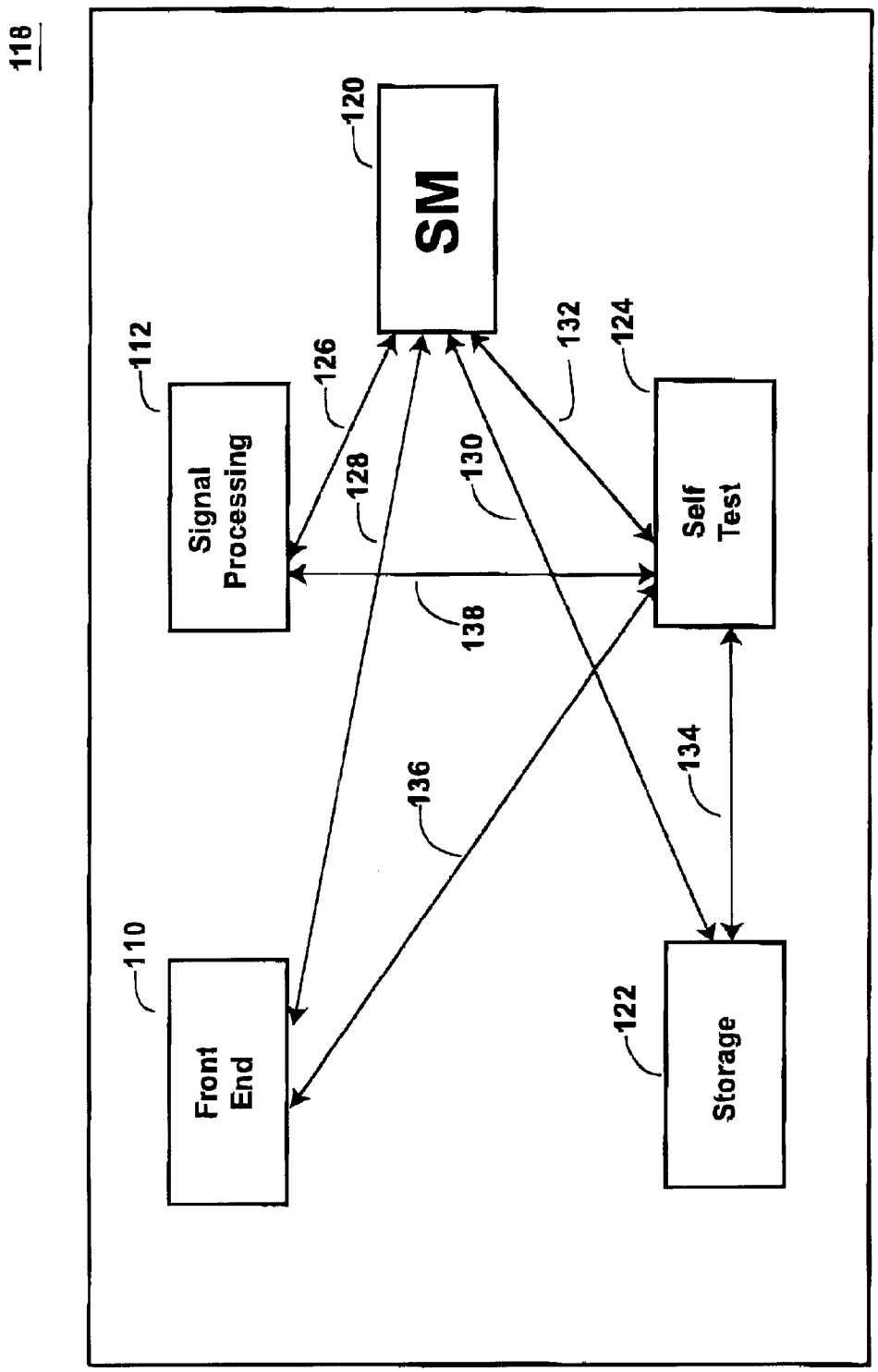
FIG. 2 is a conceptual block diagram of the functional elements included within an RFID tag integrated circuit in accordance with the principles of the present invention.

The conceptual block diagram of FIG. 2 illustrates the major functional elements of an illustrative RFID IC, or chip 118, in accordance with the principles of the present invention. The chip 118, which will also be referred to as a tag IC 118, includes the front end 110 and signal processing 112 RFID tag functional blocks previously discussed. Additionally, the tag IC 118 includes a controller 120, which, in this illustrative embodiment is a state machine (SM) 120. The SM coordinates the operation of the IC's remaining functional blocks. A storage unit 122, which may be implemented in a non-volatile storage technology, such as electrically erasable programmable read only memory (EEPROM), may be employed to store information about an item related to the IC's associated RFID tag. For example, the storage 122 may be used to store inventory control numbers, such as lot number, manufacturing location, data of manufacture, etc. for a manufactured item, such as an article of clothing.

Test circuitry 124, includes a serially loaded mode register, in accordance with the principles of the present invention. The test circuitry may be used to characterize the IC 118 during manufacturing at a step in the manufacturing process commonly referred to as wafer sort. The test circuitry 124 may also be employed at subsequent steps in the manufacturing of an RFID tag or in other circumstances. The SM 120 communicates with the signal processing 112, front end 110, storage 122, and test 124 functional elements through respective communications channels 126, 128, 130, and 132. These communications channels may be implemented in any of a variety of forms, such as a bidirectional data bus, for example. Additionally, the test functional element 124 communicates with the storage element 122, the front end 110 and signal processing 112 functional elements through respective communications channels 134, 136, and 138.

Figure 3:
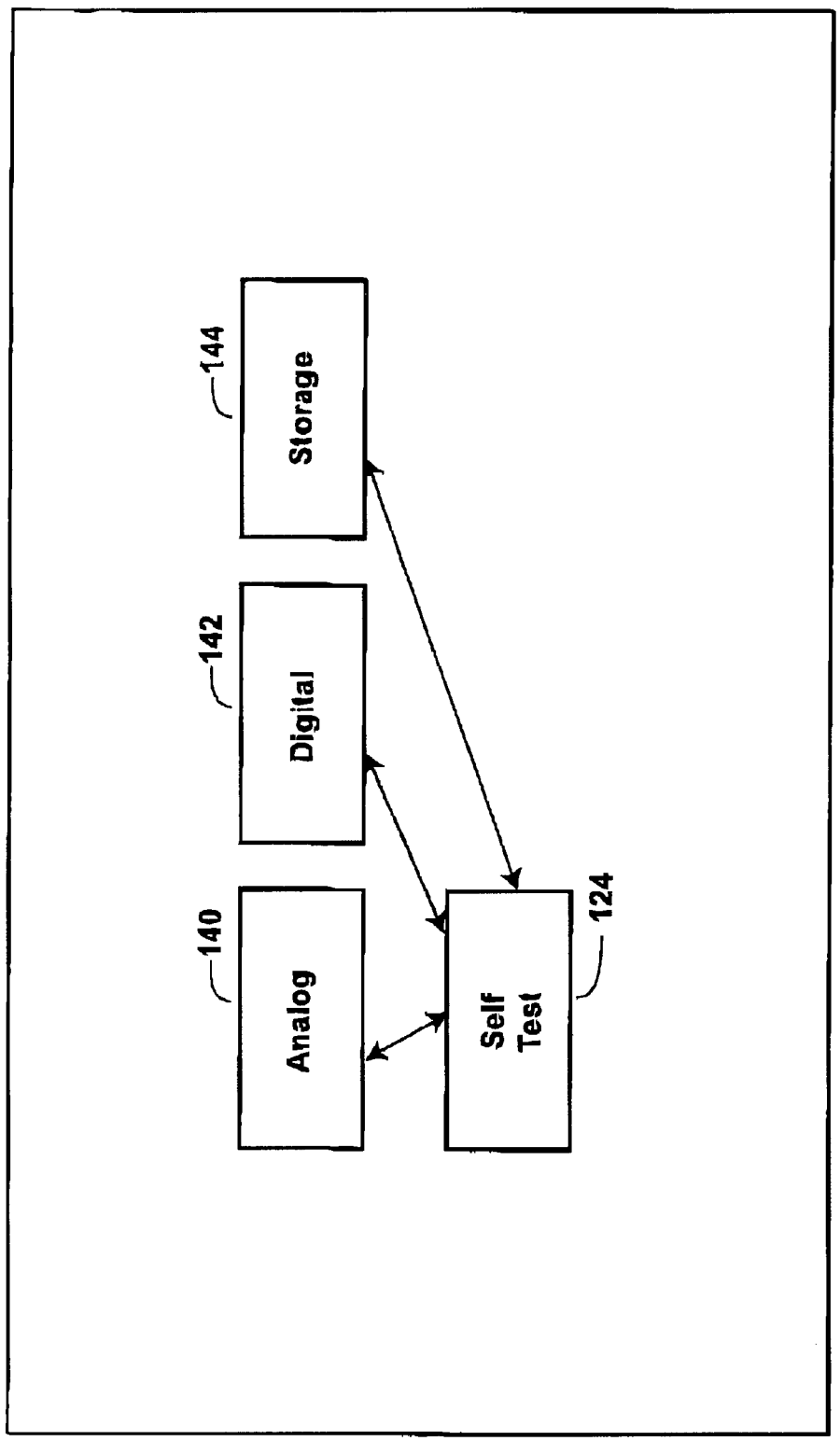
FIG. 3 is a conceptual block diagram of the test structure of an RFID tag integrated circuit in accordance with the principles of the present invention.

The conceptual block diagram of FIG. 3 illustrates the component circuitry of the new RFID IC from the perspective of the various types of circuitry employed by and tested within the tag IC 118. The test circuitry 124 is as described in the discussion related to FIG. 2.

The illustrative RFID chip includes circuit sections of three distinct types, a digital section 144, an analog section 140, and a EEPROM section 144, labeled "storage", each of which is made available for testing at wafer sort by the on-chip test circuitry 124 of the illustrative embodiment. The parameters tested by the on-chip test circuitry could be used, for example, to identify RF faults within a chip at wafer sort. That is, it may be possible to eliminate RF testing of the RFID tags which employ chips built in accordance with the principles of the present invention, if parameter profiles revealed by the tests of the illustrative embodiment correlate to RF faults uncovered by other tests.

In the illustrative embodiment, the digital section 142 test may be accomplished in either of two ways. A partial scan, which tests the majority of the chip data path and control logic, may be initiated by putting the chip in its command test mode by entering a specific digital sequence, 1000, Illustratively, in the chip's serial test mode register. Alternatively, the chip may be driven by command data in other test modes by entering 1100 or 1101 in the serial test mode register. This, command data, approach may be used to test the digital and analog sections of the chip's clock recovery and data recovery circuits.

The on-chip EEPROM 144 may be tested by invoking test modes that provide test circuitry with direct access to the EEPROM circuitry, circumventing the RF-to-EEPROM data path that would be used in normal chip operation. The test circuitry supports bulk writes, in which every byte in the data array is written with the same data, bulk odd writes ,in which every byte in the data array's odd words are is written with the same data, and bulk even writes, in which every byte in the data array's even words is written with the same data. In this illustrative embodiment, a word is eight bytes long and, odd words are, for example, bytes 8–15, 24–31, etc. In addition, the test circuitry allows write quality to be checked using a margin mode. By enabling access to critical EEPROM output signals, the test circuitry enables the evaluation of critical EEPROM internal control circuits.

The chip's analog section may be tested by testing the chip's parametrics, such as, the chip current drain or bias levels, which are available at the pin interface. A separate tester, including measurement circuitry, may be employed to measure the parametrics. For example, the performance of the IC's bias generator may be monitored by applying a voltage to a testpad and measuring the current drain at that pad. A pulldown transistor attached to the pad will draw an amount of current that is dependent upon the bias generator output.

Additionally, various test modes initiate the assessment of the performance of key analog blocks, generally using command input. Not all tests, however are command driven. Some tests, such as the parametric tests just described, are parametric tests, measuring such things as the amount of supply current an IC uses. In this illustrative embodiment, the key analog elements tested include, a bias generator, a power on reset, a main oscillator, a random roll oscillator, and a modulator/demodulator. The bias generator generates currents that are used throughout the analog and EEPROM sections of the IC to properly bias the circuitry. The power on reset block, holds the IC in the reset mode so long as the IC power supply voltage is below a threshold voltage below which the digital section may not operate properly. Testing the power on reset block entails determining whether the threshold voltage is set at the appropriate level and whether the EEPROM read is valid below that level. The main oscillator, with associated digital portion of the clock and data recovery circuitry, executes clock and data recovery functions, thereby providing the main clock for the IC. The test of this circuitry determines whether the oscillator runs within an acceptable frequency range and whether oscillator speed control functions operate properly. The random roll oscillator, a component of an on-chip random number generator, is tested to determine whether the oscillator operates within an acceptable frequency range. The modulator/demodulator strips incoming modulation from an RF carrier and executes backscatter modulation and is tested to determine whether the IC can recover and respond to a data rate command provided to the front end.

As indicated by the conceptual block diagram of FIG. 4, the RFID tag IC 118 includes test circuitry that features sense inputs and control outputs. The sense inputs are used to monitor chip parametrics, such as the chip's current drain, for example. The control outputs may operate separately or in cooperation with outputs from the SM 120. The test mode register 140 accepts input from a serial input port, labeled "Data/Reset". Mode inputs are serially clocked into the register 140 by a signal applied to an input labeled "clock". The tag IC 118 may be placed in any of a variety of modes, discussed in greater detail below, by loading a corresponding binary sequence into the test mode register 140. The modes established by the register 140 include an RF mode, which is used for normal RF operation, and various test modes. As discussed in greater detail below, the interpretation of commands entered in the SM 120 may depend upon the contents of the mode register 140.

In the illustrative embodiment, the RFID IC includes eight pads, including four test input pads, as listed in Table 1 below.

TABLE 1

PADS

1. Antenna In-(ground)
2. Test Pad 3 (function is dependent on test mode)
3. Test Pad 4 (function is dependent on test mode)
4. NMR (bias pad)
5. Vdd
6. Test Pad 1 (function is dependent on test mode)
7. Test Pad 2 (function is dependent on test mode)

In the illustrative embodiment, the tag IC includes a serially loaded, five-bit mode register. Four of the five bits are used to select the IC's operational mode and the fifth is used to signal the completion of the mode register loading. Various of the IC modes and their corresponding register entries are listed in Table 2 below.

TABLE 2

MODES

| Mode | Name | Operation |
|---|---|---|
| 0000 | RF | "normal" operation for tags in the field |
| 0001 | Command | execute tag command sent through digital interface, i.e., the digital test interface. The commands are the tag IC's "normal" commands, such as a "Read" command |
| 0010 | Margin Data Out | apply Vmargin and check data array |
| 0011 | Margin Lock Out | apply Vmargin and check lock array |
| 0100 | Write | like the Command mode, but, instead of providing data_out and lock out on the output pads, EEPROM monitor signals are provided on those pads. |
| 0101 | Bulk | activates ee_bulk_write signal to eeprom |
| 0110 | Even Bulk | activates ee_bulk_write and ee_even signals |
| 0111 | Odd Bulk | activates ee_bulk_write and ee_odd signals |
| 1000 | Scan | activates full scan mode |
| 1100 | Data rate | data applied to Antenna_In_+ |
| 1101 | Analog | data applied to Antenna_In_+; checks oscillators |

In the illustrative embodiment, test Pad 1 performs dual roles: that of a data input and that of a test reset input. When a "supervoltage", i.e., a voltage that is higher than a logic HIGH level, (in the range of 4.5 to 5.5 V, for example), is applied to test Pad 1 for one tester clock cycle, a test reset is effected. The test_reset clears all five bits of the mode register and provides a reset signal to all circuitry on the associated RFID tag. In the "RF" mode (0000 in the mode register) test Pad 1 operates as a data input pin that is used to load data into the mode register.

Test Pad 3 is used as the test clock. Five clock cycles are used to shift test mode values into the mode register. The mode register load completion bit is shifted in first, followed by the mode register bits, most significant bit first. The completion bit is shifted in first because the last bit in the shift register is used to record the "stop shifting" condition. If another bit were used to stop the shifting, the shift register might stop shifting prematurely for some bit patterns. For example, to load in the Margin Lock Out mode, the value 10011 would be shifted into the mode register, in that order. The most significant bit, having a binary value of 1, is the load completion bit and the following 0011 sets the mode, as noted in table 2, to Margin Lock Out.

In all modes except the normal RF mode, (0000), the mode register is loaded prior to running a test. If, however, a mode is not being changed between tests, reloading of the test mode register is not required. Once the mode register is loaded, tests may be executed by continuing to clock data into the IC and measuring the response at the IC output pads. In RF mode there is no need for a special mode register load because the register is reset on power-up.

Preambles and start delimiters are employed in the Data Rate and Analog test modes and in the normal RF mode. In this illustrative embodiment, the tag IC is configured to receive Manchester encoded data for these three modes of operation but accepts standard binary non return to zero data in all other modes. A cyclic redundancy check (CRC) is included in the data stream for all modes that include a command input.

All bytes in the EEPROM are treated as unlocked in all modes but RF (normal), Analog, and Data Rate. Consequently, all bits in the EEPROM may be tested, using the remaining modes.

Since an RFID tag's power supply voltage may vary widely, data stored within the tag should be retrievable, without corruption, at a wide range of power supply voltages. Nevertheless, at some low power supply voltage, data reads will fail. In the illustrative embodiment, to insure that any read which takes place is a reliable read operation, the power-on-reset level is set at a higher level than that at which data reads become reliable.

The voltage where the read fails must be below the power-on-reset level in order for the read failure to have no impact data reliability. At wafer sort, we thus must be able to evaluate the low voltage read performance of the part. The right strategy for implementing this evaluation is to find the power-ok level on each part under test and then to determine whether a read conducted at a lower supply voltage than the power_ok level (~100 mv for good margin) returns valid data. The power-ok level is the minimum voltage at which the IC stills works, including some small margin level. This value will typically vary with temperature and process, with the limiting circuitry generally being analog circuitry that runs out of "head room" as the supply voltage drops, or digital circuitry that can't keep up with the speed as the supply voltage drops.

A tag_reset signal is generated by "OR"ing test_reset and power_ok_lo_. Test_reset is asserted when a supervoltage is applied to test pad1. Power_ok_lo_is asserted when the power level is too low to safely support chip operations, generally at approximately 1.4V. To enable testing at various supply voltages, the tag_reset signal is disabled when the test_data_in signal is asserted. A low voltage read may therefore be evaluated at wafer sort by setting a high supply voltage while test data is loaded into the part from a tester. While asserting test_data_in the supply voltage may be lowered so that the tester may read the output data from the chip at a low supply voltage.

The pad definitions for the RF mode of operation, which is the "normal" mode of operation the associated RFID tags will employ in the field, are set forth in Table 3 below.

TABLE 3

Test Pad 1: not used
Test Pad 2: data_out
Test Pad 3: not used
Test Pad 4: write_enable Ored with bmac_down The RF mode is the default mode at power-up. Having output data available at test pad 2 provides a debug aid for RFID system testing. This data output could also be employed to share data in a multi-chip embodiment. A signal applied to test pad 4 may be used as an enable signal. Additionally, command sequences may be employed to generate a pulse on test pad 4, to "wake up" a battery powered RFID tag or to activate an electronic device, for example.

The pad definitions for the Command mode of operation are set forth in Table 4 below.

TABLE 4

Test Pad 1: test_reset (SV), data_in
Test Pad 2: data_out
Test Pad 3: test_clock
Test Pad 4: lock_out In this mode, tag commands are shifted in at test pad 1 at the tester clock rate provided at test pad 3. All tag commands are executable in this mode. In particular, READ, CALIBRATE, BULK WRITE, WRITE, can all be executed in this mode.

The test_clock signal is used as the EEPROM clock in this mode. In the illustrative embodiment, the RFID IC reduces the duty cycle of the EEPROM clock to a one in eight duty cycle. The frequency of the test_clock signal during EEPROM writes is eight times the data rate for tags in the RF field. For example, in the illustrative embodiment, the EEPROM was designed for a nominal data rate of 38.4 kbits/sec; therefore, the test_clock during writes should be 307.2 kHz. The nominal test_ clock frequency during high_speed testing is 1 MHz, thus, the test_clock frequency changes during EEPROM writes. The change in timing allows the tester EEPROM write timing to match RF-field EEPROM write timing for 38.4 kbits/sec data. EEPROM writes improve as the data rate is reduced, so passing EEPROM tests at the 38.4 kbits/sec rate guarantees function at the nominal system design point of 31.25 kbits/sec for RF-field operation.

The test pad definitions for the Margin Data Out mode are listed in Table 5 below. Output data, available at test pad 2, is Manchester-encoded in this mode.

TABLE 5

Test Pad 1: test_reset (SV), data_in
Test Pad 2: data_out

TABLE 5-continued

Test Pad 3: test_clock
Test Pad 4: MarginVpad

This mode operates like the Command mode, except that a MarginVpad input, which enables the quality of the EEPROM to be tested, is applied to test pad 4 and lock_out is not available on this pad. Test Pad 4 is a bidirectional pad, having a digital input (see mode 1000, Scan), an analog input (MarginVPad) and digital outputs (all other modes).

A CALIBRATE command may be used for this test. Using this command is more efficient than the READ command because (1) the CALIBRATE command does not require address loads and (2) the CALIBRATE command will read out the entire contents of the memory. The CALIBRATE command tells the IC to repeatedly scroll out the entire contents of tag memory. The CALIBRATE command may be advantageously employed in combination with the bulk commands, such as a bulk write command, to read out the contents of the memory and to thereby determine whether the bulk write was successful.

The test pad definitions for the Margin LockOut mode are set forth in Table 6 below. Output data is Manchester encoded in this mode.

TABLE 6

Test Pad 1: test_reset (SV), data_in
Test Pad 2: lock_out
Test Pad 3: test_clock
Test Pad 4: MarginVpad This mode operates like the Command mode, except lock_out is available on Test Pad 2 and Test Pad 4 is used as the MarginVpad input. As with the Margin Data Out mode, the CALIBRATE command be used for this test.

The test pad definitions for the Write mode are set forth in Table 7 below.

TABLE 7

Test Pad 1: test_reset (SV), data_in
Test Pad 2: write_done
Test Pad 3: test_clock
Test Pad 4: write_ok The Write mode operates in the same manner as the Command mode, except that the outputs are write_done and write_ok, instead of data_out and lock_out. This mode enables testing of critical EEPROM support circuitry at wafer sort.

The Bulk mode test pad definitions are set forth in table 8 below.

TABLE 8

Test Pad 1: test_reset (SV), data_in
Test Pad 2: data_out
Test Pad 3: test_clock
Test Pad 4: lock_out The Bulk mode activates the ee_bulk_write signal, which enables the bulk writing of multiple EEPROM locations. And, like the Command mode, the Bulk mode also enables the execution of bulk unlocks, but, unlike the Command mode, the Bulk mode provides for the execution of bulk locks.

Output data for the Even Bulk mode is Manchester encoded. The test pad definitions for this mode, are listed in Table 9.

TABLE 9

Test Pad 1: test_reset (SV), data_in
Test Pad 2: data_out
Test Pad 3: test_clock
Test Pad 4: lock_out This command may be used to perform EEPROM bulk write even data and the EEPROM bulk write even lock functions and may be employed during wafer sort to write stripe patterns into the EEPROM. The even bulk mode writes data to the even words in the memory (addresses 0–7, 16–23, 32–39, . . . ), leaving the odd words (addresses 8–15, 24–31, 40–47, . . . ) unchanged. This mode operates like the Command mode except the signals ee_bulk_write and ee_even are activated.

Similarly, Output data for the Odd Bulk mode is Manchester encoded. The test pad definitions for this mode are listed in Table 10.

TABLE 10

Test Pad 1: test_reset (SV), data_in
Test Pad 2: data_out
Test Pad 3: test_clock
Test Pad 4: lock_out The Odd Bulk mode operates like the Command mode except the signals ee_bulk_write and ee_odd are activated. This mode may be employed to perform the EEPROM bulk write odd data and the EEPROM bulk write odd lock functions, which may be employed during wafer sort to write stripe patterns into the EEPROM. The odd bulk modes writes data to the odd words in the memory (addresses 8–15, 24–31, 40–47, . . . ), leaving the even words (addresses 0–7, 16–23, 32–39, . . . ) unchanged.

Output data in the Scan mode is Manchester-encoded and the test pad definitions are set forth in table 11 below.

TABLE 11

Test Pad 1: test_reset (SV), data_in
Test Pad 2: data_out
Test Pad 3: test_clock
Test Pad 4: scan_enable (input)

Output data in the Data Rate mode is in a non-return-to zero format. The Data Rate mode may be used to perform a scan test for the tag IC's digital section. The test pad definitions for this mode are listed in Table 12.

TABLE 12

Test Pad 1: test_reset (SV), data_in (for mode register load only)
Test Pad 2: data_out {in downlink}; calibrate_data in uplink}
Test Pad 3: test_clock (for mode register load only)
Test Pad 4: lock_out {in downlink}; local_counter [0] (in uplink}

The Data Rate mode may be employed to test, at wafer sort, for example, the tag IC's operation at rates it will experience in the field. In the Data Rate mode, tag commands are sent through pad 1 (antenna_in_+) at the RF modulation data rate. The illustrative embodiment employs a rate within the range of 15–55 bits/sec, with 31.25 kbits/sec the standard value. In the illustrative embodiment, the data includes the calibration preamble and is Manchester encoded. The tag IC's signal recovery circuit, the interface between the IC's digital circuit and the IC's analog signal recovery/clock and data recovery circuits, the signal recovery circuit, and the exercise of writes and locks using the internal oscillator may all be tested using the Data Rate mode. Output data is FM0-encoded in this mode.

The Analog mode may be employed to test the IC's analog circuit section. The test pad definitions for the Analog mode are set forth in Table 13 below.

TABLE 13

Test Pad 1: test_reset (SV), data_in (for mode register load only)
Test Pad 2: local_counter [0]
Test Pad 3: test_clock (for mode register load only)
Test Pad 4: free_run_clk_async (output of random roll oscillator /2) {in downlink}; digital clock {in uplink}

In the Analog mode, Manchester encoded tag commands, including preambles, are sent through pad 5 (antenna_in_+) at various data rates. The five control bits of the tag IC's local oscillator may be tested by monitoring the IC's local_counter signal during the preamble of a tag command. Similarly, the tag IC's random roll oscillator may be tested by observing free_run_clk_async during the preamble of a tag command. Since the mode outputs, local_counter[0] and free_run_clk_async, are asynchronous, they are not easily captured directly by a tester. A simpler approach to testing, rather than directly decoding the output data streams in these modes, would involve counting the transitions on the signals emanating from the associated test pads to and comparing the number of transitions to an expected value. Output data on testpad2, tespad4 is the listed signal fed to the appropriate pin. Data_out is not available in this mode.

In an illustrative embodiment, the test register is serially loaded. The advantages to using a serial, rather than parallel approach, include a reduction in the number of pads required, the obviation of a decode/encode/decode circuit otherwise required to register the output of the 3-state elements used in the parallel approach, and the need for fewer supervoltage pads. Additionally, the serial approach allows for the addition test modes without changing pad count.

In the illustrative embodiment, the lock bit from the EEPROM lock array will be ignored when tag commands are issued to the IC in the following test modes:
 Command
 Margin Data Out
 Margin Lock Out
 Write
 Bulk
 Even Bulk
 Odd Bulk The arithmetic logic unit (ALU) comparisons performed to check for equality will be disabled during all tag commands in the seven test modes listed above. Consequently, any tag command that requires an alu_eq flag from the ALU will automatically meet the alu_eq condition even if the command's ID field, data field, or address field does not match the data contained in the EEPROM. Additionally, commands that require inequality (alu_ne, alu_gt, alu_lt) will not work in these seven test modes. Commands issued in the above seven test modes needn't include a preamble or a start delimiter and data is not Manchester encoded. Both the identification and CRF fields are don't cares for commands issued in any of the above seven test modes. The write, write_broadcast, bulk_write, lock, unlock, read, read_verify, and calibrate commands are available in all the above seven test modes.

The lock bit associated with an EEPROM- memory location being written to is erased when a write command is issued and a data byte associated with the command is written into the EEPROM location. The ID and CRC fields are a don't care and CRC and ID checking with the ALU are ignored with the write command.

The write_broadcast command is available in any tag state and a selected byte is written to all bytes in the EEPROM array. The lock bit associated with a data byte is erased, CRC checking is ignored, and the CRC field is a don't care.

All the bits in the EEPROM array are erased with a bulk_write command. The master lock bit and CRC checking are ignored, and the CRC field is a don't care.

The lock command is available in any tag state. The lock command locks all bits in the EEPROM lock array in bulk test mode. The ID check with ALU, address check with ALU, lockable condition, and CRC checking are ignored and the ID field and CRC fields are don't cares.

The unlock command is also available in any tag state. The unlock command erases all bits in the EEPROM lock array in the bulk test mode. The ID check with ALU, address check with ALU, lockable condition, and CRC checking are ignored and the ID field and CRC fields are don't cares. Additionally, the master lock bit and unlockable conditions are ignored.

The read command reads data from a specified location within the EEPROM array. Additionally, the ID check with ALU, address check with ALU, lockable condition, and CRC checking are ignored and the ID field and CRC fields are don't cares. Similar to a read command, in the read_verify command, the ID check with ALU, address check with ALU, lockable condition, and CRC checking are ignored and the ID field and CRC fields are don't cares. With the read_verify command, write_ok is used to return data.

With the calibrate command, the master lock bit is ignored, and the CRC field is a don't care. Data returned on the test_data_out pad follows a command protocol that includes two bytes of QUIET time, two bytes of PREAMBLE, and two bytes of CRC. The data returned is manchester encoded. Data out high disables the antenna and data out low leaves the antenna open.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A radio-frequency identification transponder (RFID tag) integrated circuit (IC) comprising:
 a front end processor for processing received radio frequency (RF) signals;
 a signal processor for producing a return signal; and
 a serially loaded test mode register configured to control the selection of tests to be performed upon the tag IC.

2. The RFID tag IC of claim 1 wherein the tag IC includes a digital test section operated under control of entries within the test mode register.

3. The RFID tag IC of claim 2 wherein the digital test section includes partial scan test circuitry.

4. The RFID tag IC of claim 2 wherein the tag IC includes a data path and control logic and the partial scan test circuitry is responsive to input from the test mode register by testing the IC data path and control logic.

5. The RFID tag IC of claim 4 wherein the RFID tag IC further includes digital clock recovery and data recovery circuitry and the test register enables testing of the digital clock recovery and data recovery circuitry.

6. The RFID tag IC of claim 2 wherein the tag IC further comprises EEPROM circuitry in communication with said front end and the test mode register enables tests which access the EEPROM circuitry through a path other than the front end.

7. The RFID tag IC of claim 6 wherein test circuitry within the IC is responsive to manipulation of the test register by enabling testing of the write margin of the EEPROM.

8. The RFID tag IC of claim 6 wherein test circuitry with the IC is responsive to manipulation of the test register by enabling the performance of a bulk even test on the EEPROM.

9. The RFID tag IC of claim 6 wherein test circuitry within the IC is responsive to manipulation of the test register by enabling the performance of a bulk odd test on the EEPROM.

10. The RFID tag IC of claim 6 wherein test circuitry within the tag IC is responsive to manipulation of the test register by enabling the performance of a bulk lock test on the EEPROM.

11. The RFID tag IC of claim 6 wherein test circuitry within the tag IC is responsive to manipulation of the test register by enabling the performance of one or more EEPROM control verification tests.

12. The RFID tag IC of claim 2 further comprising an analog circuit section and test circuitry responsive to manipulation of the test register by enabling the testing of circuit parametrics.

13. The RFID tag IC of claim 12 wherein circuit parametrics include the IC's current drain.

14. The RFID tag IC of claim 12 wherein circuit parametrics include the IC's bias levels.

15. The RFID tag IC of claim 1 further including memory and test circuitry responsive to a calibrate command by scrolling out the contents of the memory.

16. An RFID tag comprising:
   an antenna; and
   an RFID IC responsive to signals received at the antenna, the RFID IC including:
      a front end processor for processing received radio frequency (RF) signals;
      a signal processor for producing a return signal; and
      a serially loaded test mode register configured to control the selection of tests to be performed upon the tag IC.

17. The RFID tag of claim 16 wherein the tag IC includes a digital test section operated under control of entries within the test mode register.

18. The RFID tag of claim 17 wherein the digital test section includes partial scan test circuitry.

19. The RFID tag of claim 17 herein the tag IC includes a data path and control logic and the partial scan test circuitry is responsive to input from the test mode register by testing the IC data path and control logic.

20. The RFID tag of claim 19 wherein the RFID tag IC further includes digital clock recovery and data recovery circuitry and the test register enables testing of the digital clock recovery and data recovery circuitry.

21. The RFID tag of claim 18 wherein the tag IC further comprises EEPROM circuitry in communication with said front end and the test mode register enables tests which access the EEPROM circuitry through a path other than the front end.

22. The RFID tag of claim 21 wherein test circuitry within the IC is responsive to manipulation of the test register by enabling testing of the write margin of the EEPROM.

23. The RFID tag of claim 21 wherein test circuitry with the IC is responsive to manipulation of the test register by enabling the performance of a bulk even test on the EEPROM.

24. The RFID tag of claim 21 wherein test circuitry within the IC is responsive to manipulation of the test register by enabling the performance of a bulk odd test on the EEPROM.

25. The RFID tag of claim 21 wherein test circuitry within the tag IC is responsive to manipulation of the test register by enabling the performance of a bulk lock test on the EEPROM.

26. The RFID tag of claim 21 wherein test circuitry within the tag IC is responsive to manipulation of the test register by enabling the performance of one or more EEPROM control verification tests.

27. The RFID tag of claim 17 further comprising an analog circuit section and test circuitry responsive to manipulation of the test register by enabling the testing of circuit parametrics.

28. The RFID tag of claim 27 wherein circuit parametrics include the IC's current drain.

29. The RFID tag of claim 27 wherein circuit parametrics include the IC's bias levels.

30. An RFID system comprising:
   an RFID tag, inluding
      an antenna; and
      an RFID IC responsive to signals received at the antenna, the RFID IC including: a front end processor for processing received radio frequency (RF) signals;
      a signal processor for producing a return signal; and
      a serially loaded test mode register configured to control the selection of tests to be performed upon the tag IC; and
   an RFID base station configured to communicate with the RFID tag.

* * * * *